(12) United States Patent
Jinbo et al.

(10) Patent No.: US 6,438,081 B2
(45) Date of Patent: Aug. 20, 2002

(54) STORAGE MEDIA READING SYSTEM

(75) Inventors: Hiroki Jinbo, Kodaira; Hiroyuki Yonetani, Fujioka, both of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/767,921

(22) Filed: Jan. 24, 2001

(30) Foreign Application Priority Data

Jan. 27, 2000 (JP) ........................................ 2000-023261

(51) Int. Cl.$^7$ ................................................. G11B 7/00
(52) U.S. Cl. ................................... 369/47.28; 369/60.01
(58) Field of Search ............................. 369/47.1, 47.11, 369/47.28, 47.35, 47.48, 53.1, 53.34, 59.1, 60.01, 124.01

(56) References Cited

U.S. PATENT DOCUMENTS 5,117,412 A * 5/1992 Ito et al. ................. 369/47.4 X
5,886,962 A * 3/1999 Takamine et al. ..... 369/53.19 X

FOREIGN PATENT DOCUMENTS

JP 7-221800 8/1995

* cited by examiner

Primary Examiner—Muhammad Edun
(74) Attorney, Agent, or Firm—Mattingly, Stanger & Malur, P.C.

(57) ABSTRACT

A sync clock signal for information reproduction is generated using a binary signal obtained from a recording medium as a reference signal. The phase of the binary signal is compared with that of the sync clock signal. A frequency is changed based on the comparison result to generate (2m+1) multi-phase clock signals mutually shifted in phase by an integral multiple of $2\pi/(2m+1)$. Any one of these clock signals is used as the sync clock signal for information reproduction. The binary signal is delayed by a controllable delay time to generate a binary delayed signal, the phase of which is compared with those of the clock signals. The delay time of the binary delayed signal is controlled based on the comparison result so that the level change timing of the binary delayed signal is moved on a time base away from that of the sync clock signal.

10 Claims, 11 Drawing Sheets

DELAY CONTROL SIGNAL

FIG. 13A
(PHASE DISCRIMINATION FOR EVERY SECOND PERIOD)
SYNC CLOCK SIGNAL 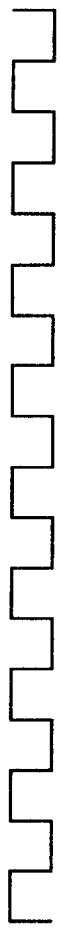
PHASE DISCRIMINATION TIMING 
FIG. 13B
(PHASE DISCRIMINATION FOR EVERY PERIOD)
SYNC CLOCK SIGNAL 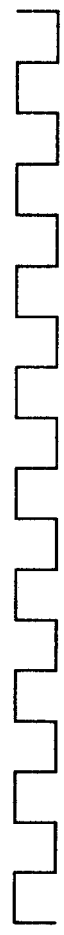
PHASE DISCRIMINATION TIMING 
DATA TO BE DISCRIMINATED BY PHASE COMPARISON  p 
p+1
BINARY DELAYED SIGNAL 

STORAGE MEDIA READING SYSTEM

BACKGROUND OF THE INVENTION

The present invention relates to a storage media reading system which can extract a sync clock signal for information reproduction and reproduced data from information recorded in the form of combinations of "1" and "0" in a digital versatile disc (DVD), a compact disc-read only memory (CD-ROM) or the like with use of such a phase-locked loop circuit as a phaselocked loop (PLL).

Recorded on an optical disc such as a DVD or CD-ROM are information or data in the form of combinations of logical values of "1" and "0". For example, when the sync clock signal has a period of T, data is recorded in combinations of signal periods of 3T to 11T. Such data recorded on the optical disc is read out by a pickup and waveform-equalized by a preamplifier and digitized to generate a binary signal. In order to reproduce recorded data from the binary signal, the PLL circuit reproduces a sync clock signal on the basis of the binary signal, and the binary signal is used as reproduced data synchronized with the reproduced sync clock signal. At this time, synchronization is achieved in the PLL circuit so that an edge of the binary signal and a falling edge of the sync click signal (when the sync clock signal has a duty of 50%, the falling edge of the sync clock signal corresponds to a middle point between adjacent rising edges of the sync clock signal) are made to be coincided. Under this condition, when the binary signal is latched at a rising edge of the sync clock signal, a highest quality of reproduced data can be acquired.

The aforementioned technique is conventionally known and is valid when the duty of the sync clock signal is 50%. However, when the duty of 50% cannot be secured, the timing of rising or falling (level change) in the binary signal goes out of the middle point between adjacent edges of the sync clock signal. Under such a condition, a small jitter takes place in the sync clock signal or binary signal, the normal value of the binary signal cannot be latched, thus resulting possibly in that erroneous reproduced data is output. In order to realize a sync clock signal having a duty of 50%, it is usual to generate a clock signal of a frequency twice as high as a required frequency and frequency divide the generated clock signal. However, nowadays, it has become difficult to generate such a high frequency signal as a transfer rate is increased. A disc such as a DVD or CD-ROM is rotated at a high speed for the purpose of enabling high-speed access, and a data transfer rate tends to also be increased correspondingly.

It is also substantially difficult to forcibly make the timing of level change in the binary signal coincide with the timing of a middle point between adjacent edges of the sync clock signal, including logical gate delay or changes in the characteristics of circuit elements. It is difficult to predict fluctuations in the duty of a clock generated in the interior of an LSI or variations in the logical gate delay upon manufacturing it.

Disclosed in JP-A-7-221800 (laid-open on Aug. 18, 1995) is a technique for automatically adjusting the phase of an edge of a clock signal to be input to a data discriminating/reproducing circuit at a already-determined phase, wherein the values of input data for phases leading or lagging with respect to a reproduced clock signal are compared with the value of the input data for the phase of the reproduced clock signal, land the phase of the reproduced clock signal in a phase synchronization loop is automatically adjusted so that these data values become equal to each other. Since this technique is directed to adjustment of the phase of the reproduced clock signal per se. separately from the phase synchronization loop, however, a result of the phase adjustment does not accurately reflect even another clock signal having a phase difference given for the aforementioned comparison, and thus it is expected that, when a data transfer rate is high, it becomes difficult to perform the phase adjustment.

SUMMARY OF THE INVENTION

It is therefore an object of the present invention to provide a storage media reading system which can generate a sync clock signal from a signal read out from a recording medium, can use the clock signal to reduce an error generated at the time of reproducing data, and can achieve a high quality of reproduction of digital data.

In accordance with an aspect of the present invention, there is provided a storage media reading system which comprises:

a phase detector having first and second input terminals, a binary signal obtained from data recorded on a recording medium and carrying the data being supplied to said first terminal;

a voltage controlled oscillator for generating (2m+1) multi-phase clock signals (m being a positive integer) which are changed in oscillation frequency according to an output of the phase detector and which are mutually shifted in phase by an integral multiple of $2\pi/(2m+1)$ and for extracting one of these multi-phase clock signals as a sync clock signal for data reproduction and for supplying part of the sync clock signal to the second input terminal of the phase detector;

a variable delay circuit for delaying the binary signal by a controllable delay time to generate a binary delayed signal; and a delay control circuit including first circuits for determining a value of the binary delayed signal from the variable delay circuit in synchronism with the sync clock signal to generate a reproduced data signal and also including a second circuit for comparing a phase of the binary delayed signal from the variable delay circuit with phases of the multi-phase clock signals from the voltage controlled oscillator to generate a delay control signal to be supplied to the variable delay circuit for control of the delay time, and wherein the reproduced data signal and sync clock signal are used to reproduce the data recorded in the recording medium.

In accordance with another aspect of the present invention, there is provided a storage media reading system which comprises a data reproducing circuit for reproducing a sync clock signal in a phase-locked loop circuit on the basis of a digital binary signal read out from a recording medium and for generating reproduced data through synchronization of the binary signal with the sync clock signal. The phase-locked loop circuit has a ring type voltage-controlled oscillator in its phase-locked loop which includes an odd number of delay gate stages whose delay times are determined by the phase comparison result. One of outputs of the delay gate stages is used as a sync clock signal fed back in the phase-locked loop. The data reproducing circuit further has a variable delay circuit for variably delaying the binary signal to generate a binary delayed signal and also has a delay control circuit for comparing the phase of the binary delayed signal from the variable delay circuit with phases of clock signals generated in the plurality of delay gate stages and for supplying the delay control signal to the variable delay circuit in such a manner that the binary delayed signal has a predetermined phase difference with respect to the sync clock signal.

In the aforementioned aspect of the present invention, the phase of the binary delayed signal to the sync clock signal is optimumly controlled on the basis of a phase relationship between the output clock signals from the delay gate stages present in the voltage controlled oscillator and the binary delayed signal. For example, the delay of the delayed signal from the variable delay circuit is controlled so that the timing of a level change in the delayed signal is away from a rising edge of the sync clock signal. As a result, when the duty of the sync clock signal is shifted from 50% as an increased data transfer rate causes n increased frequency of the sync clock signal, even generation of a jitter in the sync clock signal or binary signal enables a normal signal value to be latched by a latch circuit and thus accurate reproduced data corresponding to the binary signal to be obtained.

Further, the phase discrimination is carried out with use of the multi-phase clock signals within the voltage controlled oscillator. Thus even when a change in the transfer rate of the input signal causes a change in the oscillation frequency of the voltage controlled oscillator, a phase discrimination sensitivity can be kept constant.

Furthermore, because of the delay control of the binary signal, control can be easily realized with a reliability higher than that of the case of performing delay control of the multi-phase clock signals equally.

The delay control circuit has, as an example, a plurality of latch circuits provided to correspond in number to the output clock signals of the delay gate stages in the voltage controlled oscillator for latching the value of the binary delayed signal in synchronism with a change in a first level in the output clock signals, a phase discriminating circuit for generating a advance/delay detection signal indicative of a time relationship of the binary delayed signal with respect the respective outputs of the delay gate stages on the basis of outputs of the plurality of latch circuits, and a signal producing circuit for supplying a delay control signal to the variable delay circuit to change the timing of a level change in the binary delayed signal to such a direction as away from the timing of the first level change of the sync clock signal on the basis of the advance/delay detection signal from the phase discriminating circuit.

With the aforementioned arrangement, the entire latched state of the latch circuits is sequentially determined for each one period of the clock signal outputted from each one of the delay gate stages. The latched state is discriminated for each one period and the delay control signal is sequentially updated on the basis of the discriminated result.

The delay control circuit may, as another example, include a plurality of sets of latch circuits for each of the output clock signals from the delay gate stages in the voltage controlled oscillator. In each set of latch circuits, a plurality of latch circuits are connected in series, their latch clock terminals are commonly connected, so that latching operation is carried out in synchronism with the first level change of the clock signals to supply the binary delayed signal to a latch data input terminal of the first stage. The delay control circuit further has a phase discriminating circuit for generating a advance/delay detection signal indicative of a time relationship of the phase of the binary delayed signal with respect to the phases of the clock signals on the basis of outputs of the latch circuits, and a signal producing circuit for supplying the delay control signal to the variable delay circuit to change the timing of the level change of the binary delayed signal to such a direction as away from the timing of the first level change of the sync clock signal on the basis of the advance/delay detection signal from the phase discriminating circuit.

The phase discriminating circuit is only required to output a detection signal at a rate of once for a plurality of cycles of the output clock signals from the delay gate stages. Or the signal producing circuit is only required to receive a delayed signal from the phase discriminating circuit at a rate of once for a plurality of cycles of the output clock signals from the delay gate stages.

With the aforementioned arrangement, when n stages of latch circuits connected in series are provided for example, the latched state of the entire latch circuits is sequentially determined for each n periods of the output clock signal of one of the delay gate stages in the voltage controlled oscillator. When a signal of, e.g., 3T to 11T is reproduced from a disc, however, pulses of T and 2T may be included into a read binary signal. When such binary signal is subjected to detection of the phase state with the sync clock signal, a phase control error will be large. In order to avoid this, after the latch state of the entire latch circuits is determined for each n periods of the clock signals, its latched data is discriminated and the delay control signal is updated. For example, when a pulse of 1T is mixed, such a state that the binary delayed signal has level changes during consecutive two periods of the sync clock signal, it is designed so that this will not be detected. In short, it is only required to detect by pattern matching or the like whether or not the latched state of the entire latch circuits corresponds to any one of a plurality of states to be detected for each n periods of the clock signal. Such a state as caused by the noise of 1T is previously excluded from the states to be discriminated. For example, when such a shift register arrangement that latch circuits are connected in series is employed to detect a level change point in the binary delayed signal with respect to a unit of latch data corresponding to a plurality of periods of the sync clock signal, such an abnormality as to discriminate two consecutive level change points, e.g., an erroneous level change in the binary delayed signal caused by la damage or the like on the disc, can be discriminated and thus delay control to the variable delay circuit can be realized with use of only reliable signal changes.

As a method for realizing the above phase discrimination and the generation of the delay control signal, two methods which follow may be employed. Both of the two methods are based on averaging or sensitivity lowering, to thereby suppress a state in which, when the phase of the sync clock signal or binary signal is disturbed in a one-shot manner or irregularly, this is reflected directly on the phase control to lead to a difficulty in convergence of the phase control.

In first one of the above methods, the phase discriminating circuit detects outputs of the plurality of latch circuits concurrently to detect whether the timing of a level change in the binary delayed signal is advanced or delayed with respect to the timing of the first level change in the sync clock signal. At this time, the signal producing circuit includes a first operational circuit which updates a count value in a first direction in response to the discriminated result of the phase-advanced state by the phase discriminating circuit and updates the count value in a second direction in response to the discriminated result of phase-delayed state by the phase discriminating circuit. Further included in the signal producing circuit is an arrival detecting circuit which detects whether the count value of the first operational circuit arrived at a first threshold value in the first direction or at a second threshold value in the second direction. And also included in the signal producing circuit is a second operational circuit which updates the value of the delay control signal in a third direction in response to the detection of arrival at the first threshold value thereby and which updates the value of the delay control signal in a fourth direction in response to the detection of arrival at the second threshold value thereby. As a result, the variable delay circuit advances the timing of the level change of the binary delayed signal and locates the timing away from/the first level change of the sync clock signal due to the updating of the value of the delay control signal in the third direction; and delays the timing of the level change of the binary delayed signal and locates the timing away from the timing of the first level change of the sync clock signal due to the updating of the value of the delay control signal in the fourth direction.

With the above arrangement, when it is judged on the basis of the phase discrimination of the sync clock signal and binary delayed signal that the phase state is out of a control target, the count value of the second operational circuit for generating the delay control signal to the variable delay circuit is incremented or decremented. For the purpose of modifying a control sensitivity, the first operational circuit integrates the phase state of the binary delayed signal delayed or advanced with respect to the sync clock signal, and, when its integrated value reached its threshold value, updates the count value (delay control signal) of the second operational circuit, thereby updating a delay to the variable delay circuit. Accordingly a phase relationship between the sync clock signal and binary delayed signal is stably converged into a control target.

In the second method, the phase discriminating circuit detects outputs a plurality of latch circuits concurrently to detect how much the timing of the level change of the binary delayed signal is advanced or delayed with respect to the timing of the first level change of the sync clock signal. At this time, the signal reproducing circuit includes a first operational circuit which updates a count value in the first direction in response to the degree (time length) of advance detected by the phase discriminating circuit and which updates the count value in the second direction in response to the degree (time length) of delay detected by the phase discriminating circuit. Further included in the signal producing circuit is an arrival detecting circuit which detects whether the count value of the first operational circuit arrived at a first threshold value in the first direction or arrived at a second threshold value in the second direction. Also included in the signal producing circuit is a second operational circuit which updates the value of the delay control signal in the third direction in response to detection of the arrival at the first threshold value by the arrival detecting circuit and which updates the values of the delay control signal in the fourth direction in response to detection of the arrival at the second threshold value thereby. As a result, the updating of the value of the delay control signal in the third direction causes the variable delay circuit to advance the timing of the level change of the binary delayed signal to locate the timing away from the timing of the first level change of the sync clock signal; while the updating of the value of the delay control signal in the fourth direction causes the variable delay circuit to delay the timing of the level change of the binary delayed signal to locate the timing away from the timing of the first level change of the sync clock signal.

In this case, since the judgement including the size of an error to the control target is carried out, convergence to the control target is made fast.

With respect to the first operational circuit, its count value is initialized in response to the updating operation of the delay control signal by the second operational circuit. The initialization means to reset the first operational circuit or to preset a prescribed value therein.

When the variable delay circuit is made up of a D/A converter for converting the delay control signal to an analog signal and a delay circuit for variably controlling its delay time by controlling its mutual conductance in response to a signal outputted from the D/A converter, a part of the arrangement of the voltage controlled oscillator may also serve as a part of the variable delay circuit in common.

The above and other objects and novel features of the present invention will become clear as the following description of the invention advances as detailed with reference to preferred embodiments of the invention as shown in accompanying drawings.

BRIEF DESCRIPTION OF THE DRAWINGS

FIG. 13A is a diagram for explaining a first method for the operation of the phase discriminating circuit in the delay control circuit of FIG. 11; and FIG. 13B is a diagram for explaining a second method for the operation of the phase discriminating circuit Fin the delay control circuit of FIG. 11.

DESCRIPTION OF THE EMBODIMENTS

Figure 1:
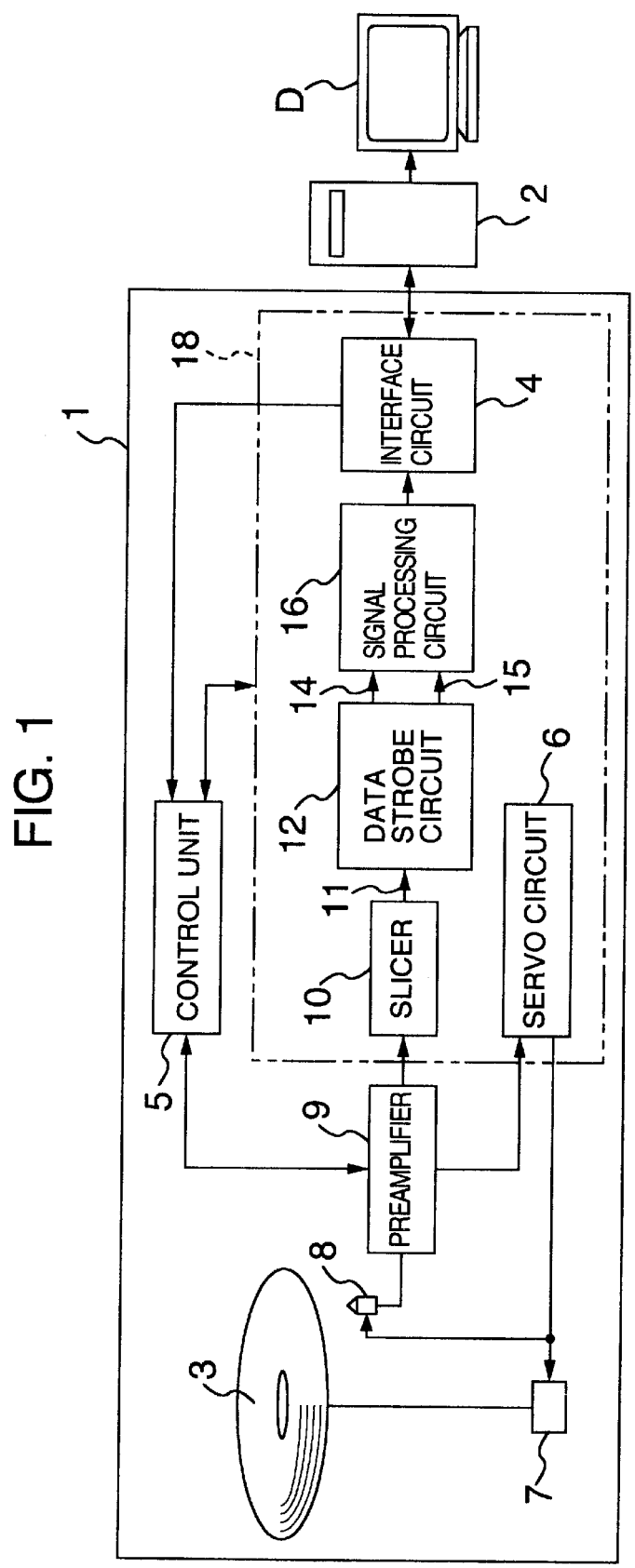
FIG. 1 is a block diagram of a disc drive unit such as a DVD or CD-ROM drive unit as an example of a storage media reading system.

FIG. 1 shows a disc drive unit 1 such as a DVD or CD-ROM drive unit as an example of a storage media reading system in accordance with an embodiment of the present invention. An optical disc 3 as a recording medium of DVD, CD-ROM, etc. has information or data recorded thereon in the form of combinations of logical values 1 and 0. Assuming for example that a sync clock signal has a period of T, then information or data is recorded in combinations of signals having periods of 3T to 1T. The disc drive unit 1 is connected to a host computer 2 by means of an interface such as (AT attachment packet interface) ATAPI. A read instruction issued from the host computer 2 to the disc drive unit 1 passes through an interface circuit (I/F) 4 and arrives at a control unit 5. The control unit 5 interprets the read instruction and controls respective blocks. A servo circuit 6 controls the rotational speed of a spindle motor 7 or the position of a pickup 8. Information or data (which will be referred to merely as information or data, hereinafter) recorded on the disc 3 is read out by the pickup 8, waveform equalized by a preamplifier 9, and then output to a slicer 10 as a radio frequency (RF) signal such as an eight to fourteen modulation (EFM) signal. The slicer 10 digitizes the received RF signal with an optimum slice level into a binary signal 11 having logical values 1 and 0, and then outputs the binary signal 11 to a data strobe circuit 12. The binary signal 11 is a serial signal carrying information recorded on the disc 3. The data strobe circuit 12 includes a phase synchronizing circuit such as a phase-locked loop (PLL) circuit for reproducing a sync clock signal 14 (also referred to as the reproduced clock signal) synchronized with the binary signal 11 and a data reproducing circuit for generating reproduced data 15 obtained by synchronizing the binary signal 11 with the sync clock signal 14.

The sync clock signal 14 and reproduced data 15 issued from the data strobe circuit 12 are supplied to a signal processing circuit 16. The signal processing circuit 16 delivers the reproduced data 15 to a buffer in synchronism with the sync clock signal 14. In the operation of the signal processing circuit 16 of reading out the reproduced data 15 from the buffer and subsequent operations thereof, the reproduced data 15 is subjected to an error correction or the like with use of a clock generated by a crystal oscillator as a sync clock signal, passed through the interface circuit 4, transferred to the host computer 2, and eventually reproduced therein as recorded information.

In FIG. 1, the control unit 5 may be implemented in the form of a microcomputer of a semiconductor integrated circuit. Further, circuit elements collectively by reference numeral 18 may be formed in the form of a single semiconductor integrated circuit chip as a disc controller. It is also possible to mixedly mount the control unit 5 on the disc controller. Reference symbol D denotes a display unit coupled with the host computer 2.

Figure 2:
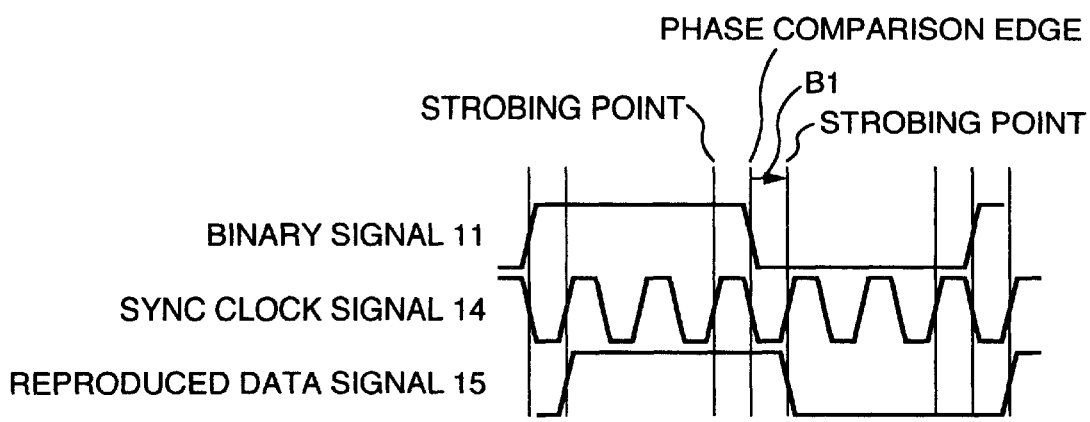
FIG. 2 is a time chart showing a phase relationship between a reproduced data signal and a sync clock signal when the sync clock signal has a duty of 50%.
Figure 3:
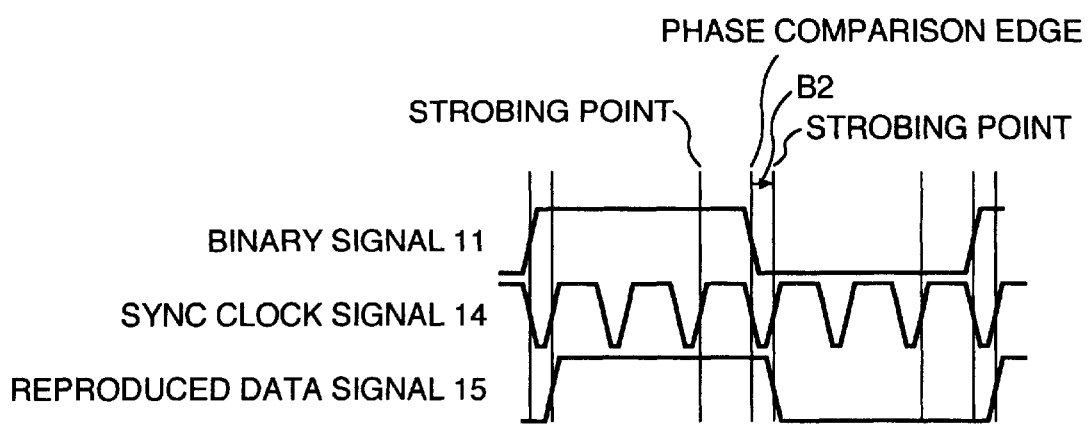
FIG. 3 is a time chart showing a phase relationship between the reproduced data signal and the sync clock signal when the duty of the sync clock signal is not 50%.

When the sync clock signal 14 is reproduced so that a falling edge (second level change) of the sync clock signal 14 is made to coincide with an edge (level change) of the binary signal 11 from the slicer 10 as exemplified in FIG. 2, it is most suitable to determine the value of the binary signal 11 at a rising edge (first level change) of the sync clock signal 14 and latch it as reproduced data in order to acquire a highest quality of reproduced data. This method is valid when the sync clock signal has a duty of 50% as already explained above. However, when it is impossible to secure the duty 50%, the timing of the level change point in the binary signal 11 is shifted from a middle (one half of one period) between two consecutive or adjacent rising or falling edges, as exemplified in FIG. 3. Thus even when a small jitter takes place in the sync clock signal 14 or binary signal 11, erroneous reproduced data may be output with a high possibility. More specifically, in the case of FIG. 2, when jitters in the sync clock signal 14 and binary signal 11 are smaller than B1, no error takes place in reproduced data. In the case of FIG. 3, however, even in the event where the jitters in the sync clock signal 14 and binary signal 11 are smaller than B1, if the jitters are larger than B2, then an error takes place in the reproduced data. In order to realize a clock signal having a duty of 50%, it is usual to generate a clock signal of a frequency twice as high as a required frequency and frequency divide the generated signal. However, since it has become difficult to generate such a high frequency signal as the transfer rate is increased, it is substantially difficult to realize the duty 50% to eliminate the disadvantage of the case of FIG. 4. In addition, it is further difficult to make accurately and forcibly the timing of level change of the binary signal coincide with the middle point between consecutive or adjacent rising or falling edges of the sync clock signal in consideration of gate transfer delay time and secular changes.

Detailed explanation will be made as to an example of the data strobe circuit 12 which forms a data reproducing device capable of avoiding generation of erroneous reproduced data even when the sync clock signal 14 cannot have a duty of 50%.

Figure 4:
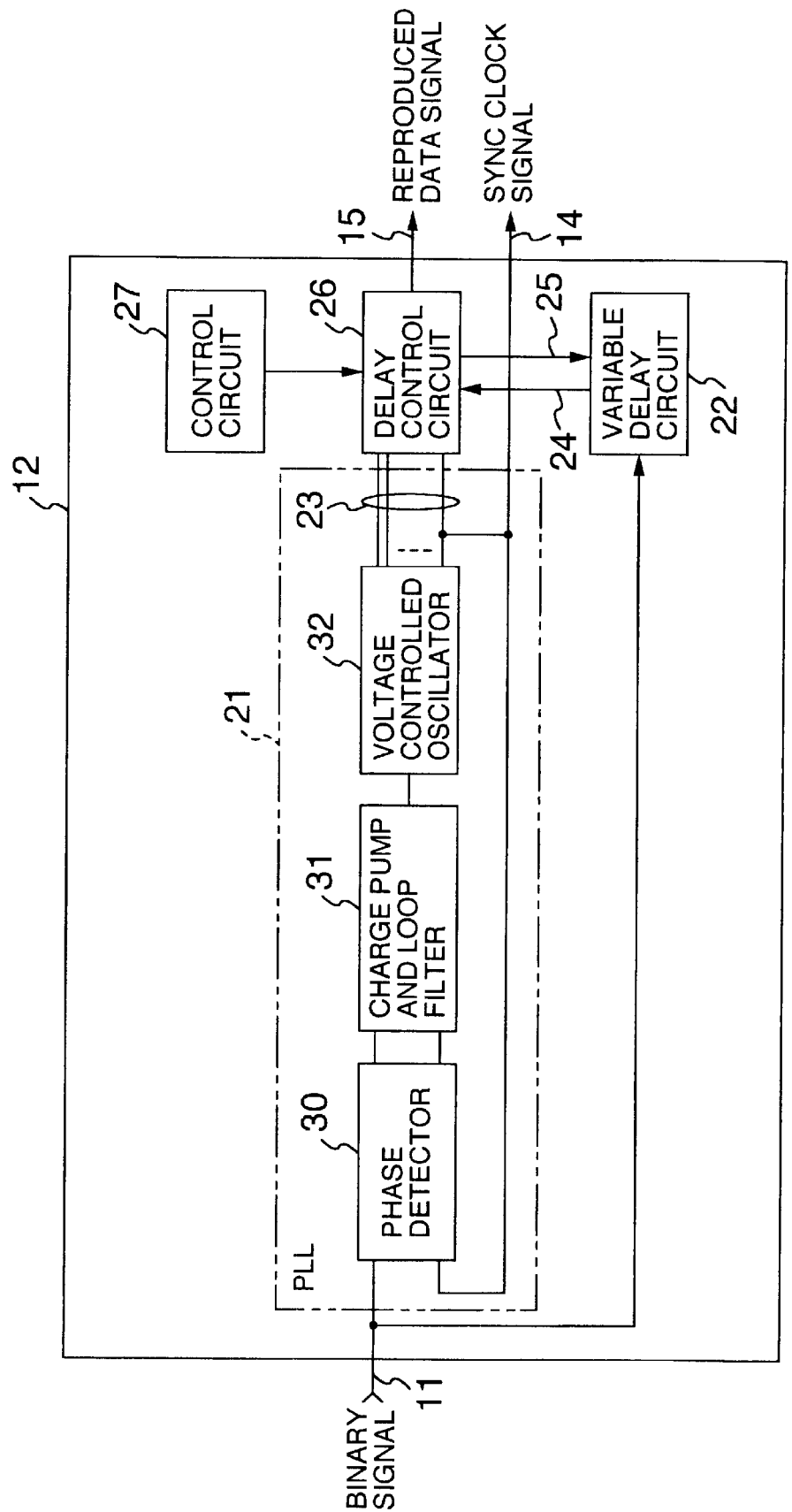
FIG. 4 is a block diagram of an arrangement of a data strobe circuit as an example of a data reproducing device.

Shown in FIG. 4 is an exemplary entire arrangement of the data strobe circuit 12. The data strobe circuit 12 includes a PLL circuit 21 for generating the sync clock signal 14 with use of the binary signal 11 as a reference signal, a variable delay circuit 22 for delaying the binary signal 11 by a controllable time to generate a binary delayed signal 24, a delay control circuit 26 for comparing the phases of multilphase clock signals 23 generated by a voltage controlled oscillator of the PLL circuit 21 with the phase of the binary delayed signal 24 issued from the variable delay circuit 22 and generating a delay control signal 25 on the basis of the comparison result, and a control circuit 27 for controlling the delay control circuit 26.

The PLL circuit 21 has a phase detector 30, a charge pump and loop filter 31, and a voltage controlled oscillator 32.

Figure 5:
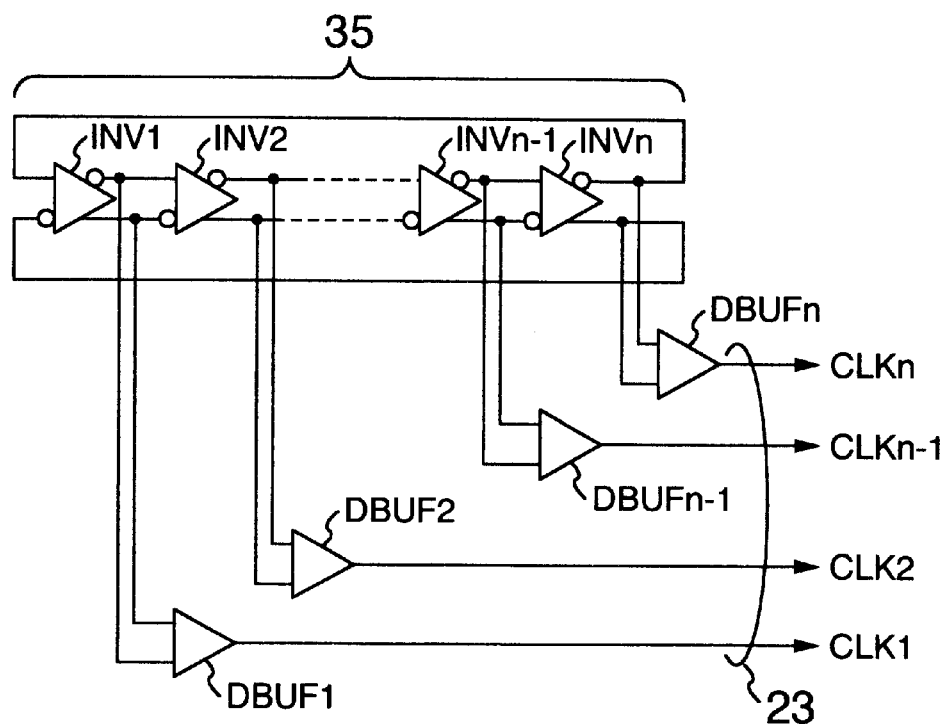
FIG. 5 a logical circuit as an example of a voltage controlled oscillator which can be used in the data strobe circuit shown in FIG. 4.

FIG. 5 shows an example of the voltage controlled oscillator 32. The voltage controlled oscillator 32 has a ring oscillator 35 which includes n (odd number) differential inverters INV1 to INVn as delay gate stages connected in a ring shape. The differential inverters INV1 to INVn output differential signals respectively. A power supply for supplying operational power to the respective differential inverters INV1 to INVn is a variable power supply (not shown) whose mutual conductance is controlled by a control voltage as an output of the charge pump and loop filter 31. The control voltage from the charge pump and loop filter 31 determines the oscillation frequency of the voltage controlled oscillator 32. Differential outputs of the differential inverters INV1 to INVn are converted respectively into a single phase by differential input buffers DBUF1 to DBUFn to form n-phase clock signals 23 (CLK1 to CLKn) the phases of which are sequentially shifted by $2\pi/n$. Any one of the multi-phase clock signals CLK1 to CLKn is fed back to the phase detector 30 as the sync clock signal 14.

Figure 6:
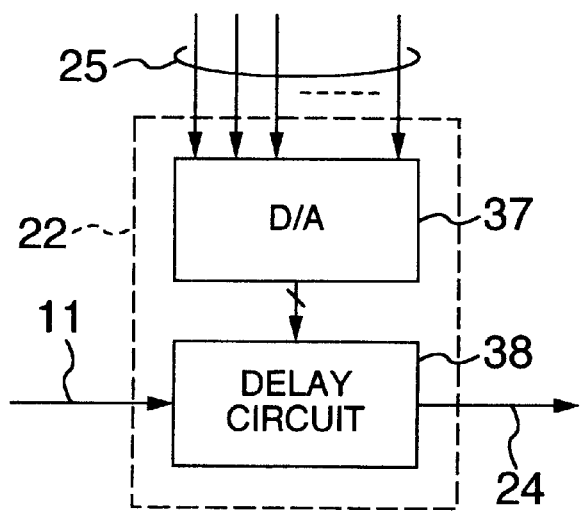
FIG. 6 is a block diagram as an example of a variable delay circuit which can be used in the data strobe circuit of FIG. 4.

FIG. 6 shows an example of the variable delay circuit 22. The variable delay circuit 22 has a D/A converter 37 for converting the delay control signal 25 to an analog signal, and a delay circuit 38 whose mutual conductance for example is controlled by an output signal of the D/A converter 37 to thereby variably control its delay time. For example, the delay circuit 38 can be arranged so that, though not shown, the binary signal 11 is supplied to first one of the plurality of stages of the differential inverters connected in series, the binary delayed signal 24 is obtained from the output of the final stage, the differential inverters employ a variable power supply (not shown) whose mutual conductance is controlled by the control voltage as the output of the D/A converter 37 to generate the binary delayed signal 24 having a delay time controlled by the value of the delay control signal 25.

Figure 7:
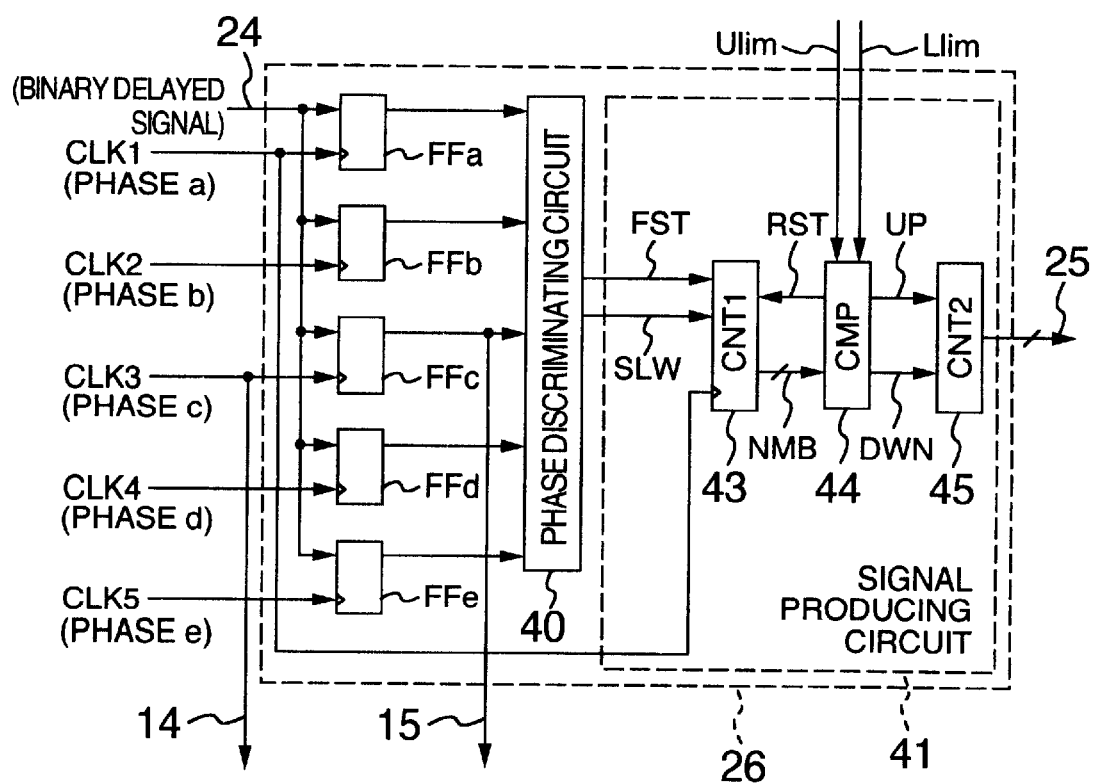
FIG. 7 is a block diagram as an example of a delay control circuit which can be used in the data strobe circuit of FIG. 4 and which includes a phase discriminating circuit for detecting a level change in a binary delayed signal with respect to one period of the sync clock signal.
Figure 8:
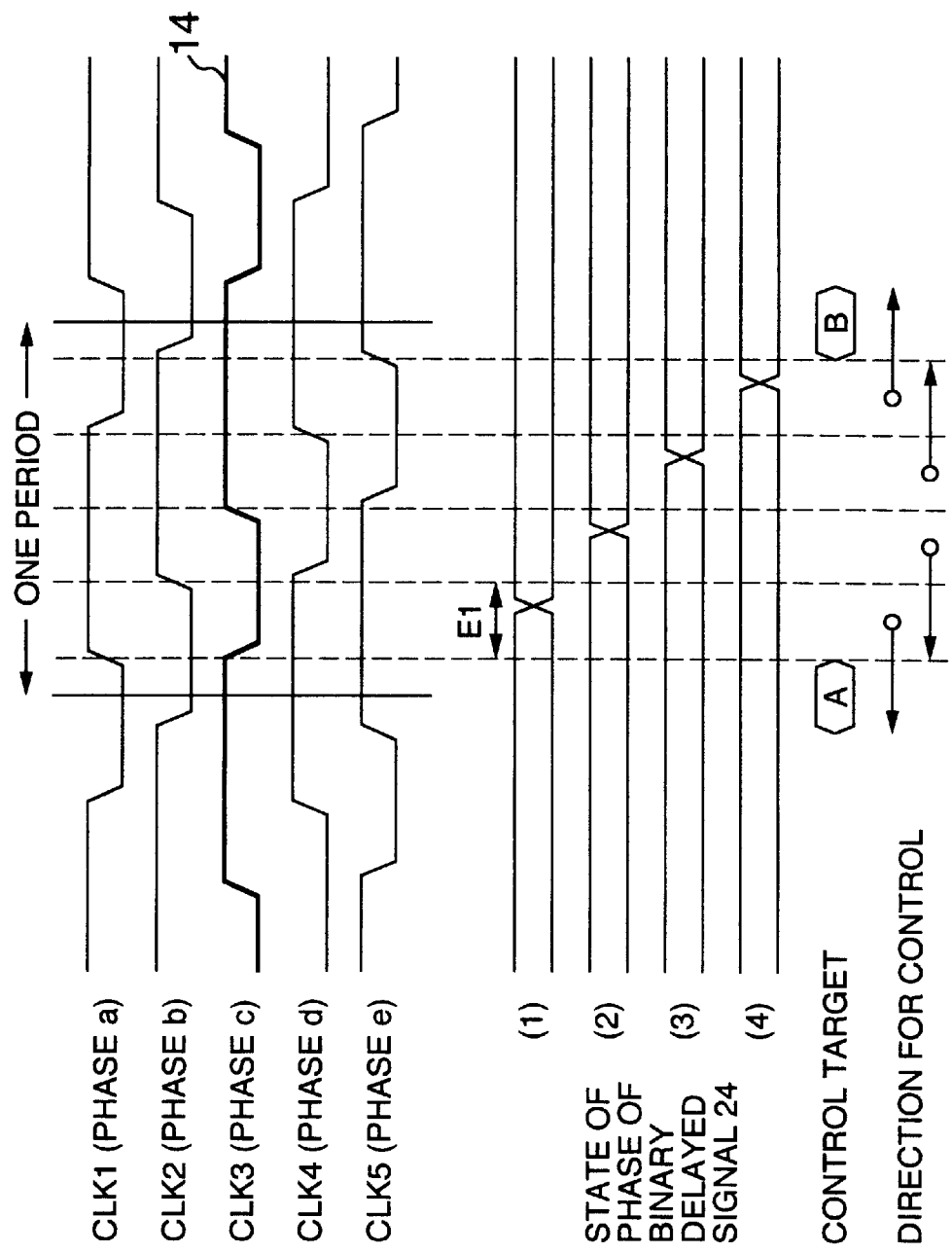
FIG. 8 is a time chart showing phase detecting operation of the phase discriminating circuit of FIG. 7.

FIG. 7 shows a first example of the delay control circuit 26. FIG. 8 shows exemplary operational timing of the delay control circuit 26 having an arrangement of FIG. 7. It is assumed in this example hat n=5 and 5-phase clock signals CLK1 to CLK5 sequentially shifted by $2\pi/5$ from the voltage controlled oscillator 32 are used. A single latch circuit is provided for each of the 5-phase clock signals. The phases of the 5-phase clock signals CLK1 to CLK5, that is, phases a, b, c, d and e are sequentially supplied to latch clock input terminals of latch circuits FFa, FFb, FFc, FFd and FFe. In this case, the phase c is used as the sync clock signal 14, and the output of the latch circuit FFc to be latched by the phase c and to be explained later is used as the reproduced data signal 15. The binary delayed signal 24 is supplied to data input terminals of the latch circuits.

The delay control circuit 26 includes a first circuit having a plurality of latch circuits FFa to FFe for determining the value of the binary delayed signal 24 and latching it as reproduced data in synchronism with the first level change (rising change) of the multi-phase clock signals CLK1 to CLK5, a phase discriminating circuit 40 for generating a advance/delay detection signal indicative of a time relationship of the phase of the binary delayed signal 24 to the phases of the multi-phase clock signals CLK1 to CLK5 on the basis of outputs of the latch circuits FFa to FFe, and a second circuit having a signal producing circuit 41 for outputting the delay control signal 25 to the variable delay circuit 22 to change the timing of the level change of the binary delayed signal 24 in such a direction as away from the timing of the first level change (rising change) of the sync clock signal 14 on the basis of the output signal of the phase discriminating circuit 40.

The phase discriminating circuit 40 concurrently detects (reads out) the outputs of the plurality of latch circuits FFa to FFe, judges whether the timing of the level change of the binary delayed signal 24 leads or lags the timing of the rising change of the sync clock signal 14, and generates a advance/delay detection signal (FST or SLW). The multi-phase clock signals CLK1 to CLK5 have phase differences $-4\pi/5$, $-2\pi/5$, $+2\pi/5$ and $+4\pi/5$ of the phases a, b, d and e with respect to the phase c as a reference phase. It is not necessarily required for signals of the phases a, b, c, d and e to have a duty of 50% and is only required for the signals to be shifted in phase substantially equally. The signals of the phases a, b, d and e are auxiliary clock signals for discriminating a time relationship between the phase of the sync clock signal 14 and the phase of the binary delayed signal 24. All data held in the 5 latch circuits FFa to FFe can become inputs to the phase discriminating circuit 40 to detect the timing of level change (rising or falling change) of the binary delayed signal 24. Assuming that the sync clock signal 14 has a period of T, then the clock signals sequentially phase shifted by $2\pi/5$ sequentially update the data of the latch circuits FFa to FFe and thus the inputs to the phase discriminating circuit 40 are continued to change for each T/5 period. The judgement of the time relationship between the phases of the multi-phase clock signals CLK1 to CLK5 and the phase of the binary delayed signal 24, is required to wait until the latch data of all the latch circuits FFa to FFe are updated or provided in a duration corresponding to at least one period of the sync clock signal 14. In the example of FIG. 7, the phase discriminating circuit 40 discriminates time-base relation of phases of the binary delayed signal 24 and the multi-phase clock signals 14 in synchronism with a rising edge of the clock signal CLK1 of the phase a and the signal producing circuit 41 generates a advance/delay detection signal.

For example, with respect to the timing of discrimination of the phase discriminating circuit 40, if the output value of the latch circuit FFa has a logical value of 1 and the output values of the latch circuits FFb to FFe have all logical values of 0, then the phase state of the change point of the binary delayed signal 24 is present in such a range E1 as exemplified by FIG. 8, (1) and the change is judged that it is a falling change. The phase discriminating circuit 140 discriminates such a phase state as exemplified by FIG. 8, (1), (2), (3) or (4) each time the binary delayed signal 24 rises or falls.

A desirable state for the discriminated result of the phase discriminating circuit 40 is that, even when the sync clock signal 14 cannot have a duty of 50% as shown in FIG. 3, a margin of a width B1 corresponding to nearly half of the period of the sync clock signal 14 can be obtained with respect to a jitter in the binary signal 11 or sync clock signal 14 as in FIG. 2. In other words, the timing of the level change of the binary delayed signal 24 is set in a state A or B with respect to the sync clock signal 14 of the phase c as exemplified in FIG. 8. It cannot be avoided that a jitter takes place in the binary delayed signal 24 or sync clock signal 14 as already mentioned above but the jitter effect can be avoided by setting the timing of the level change of the binary delayed signal 24 on the time base away (as spaced) from the timing of the level change (e.g., rising edge) of the sync clock signal 14 as the latch timing of the reproduced data. Accordingly the states A and B in FIG. 8 are control targets, and the states (1) and (2) indicate that the binary delayed signal 24 is delayed with respect to the sync clock signal 14 when viewed from the target, while the states (3) and (4) indicate that the binary delayed signal 24 is advanced with respect to the sync clock signal 14.

The phase discriminating circuit 40, when judging the delayed state, asserts a delay detection signal SLW in the signal producing circuit 41 as a advance/delay detection signal, whereas the phase discriminating circuit 40, when judging the advanced state, asserts an advance detection signal FST in the signal producing circuit 41.

The signal producing circuit 41 has a first up/down counter (CNT1) 43 as a first operational circuit, a comparator (CMP) 44 as an arrival detecting circuit, and a second up/down counter (CNT2) 45 as a second operational circuit.

Figure 9:
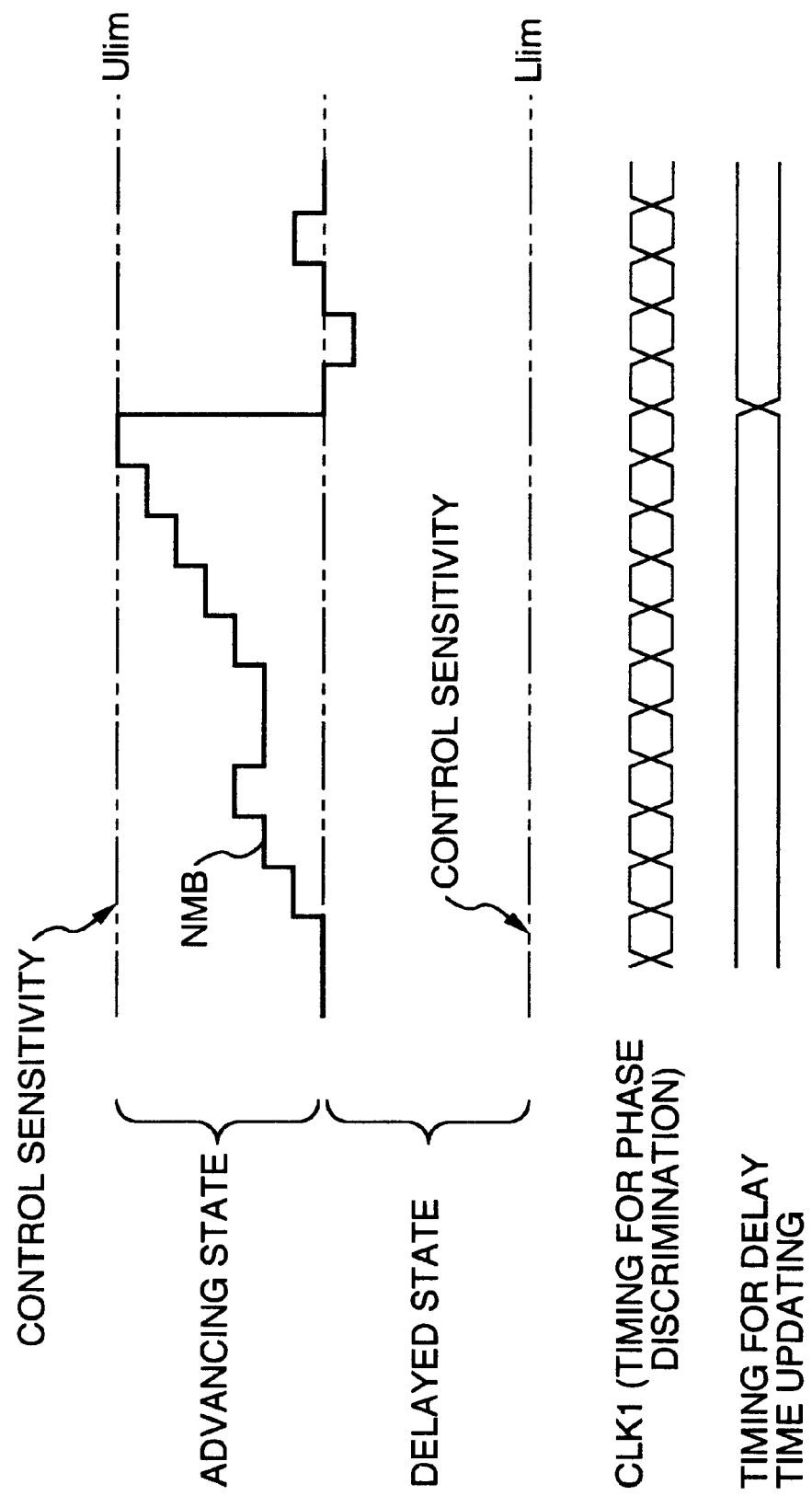
FIG. 9 is a time chart showing an example of update timing of the delay control signal with respect to a count value of a first up/down counter in FIG. 7.

The first up/down counter 43, as exemplified in FIG. 9, inputs the delay detection signal SLW and advance detection signal FST in synchronism with the rising edge of the clock signal CLK1 of the phase a, decrements by −1 in response to the assert state of the delay detection signal SLW, and increments by +1 in response to the assert state of the advance detection signal FST.

The comparator 44 inputs a count value NMB from the up/down counter 43 and detects whether the count value NMB reached a first threshold value, e.g., an upper limit value Ulim or reached a second threshold value, e.g., a lower limit value Llim. The upper and lower limit values Ulim and Llim are values which are used to determine the control sensitivity of the delay control circuit 26 programmably assigned by the control circuit 27. The comparator 44 asserts an up signal UP as an arrival detection signal when detecting an arrival at the upper limit value Ulim, and asserts a down signal DWN when detecting an arrival at the lower limit value Llim. The assert state of the up or down signal UP or DWN is informed to the first up/down counter 43 in the form of a reset signal RST, whereby the count value of the first up/down counter 43 is reset at its initial value.

The second up/down counter 45 inputs the up and down signals UP and DWN, counts down by −1 in response to the assert state of the down signal DWN, and counts up by +1 in response to the assert state of the up signal UP. The count value of the second up/down counter 45 is output as the delay control signal 25.

As the value of the delay control signal 25 is counted down and decreased, the variable delay circuit 22 advances the timing of the level change of the binary delayed signal 24 in such a manner that the timing of the level change of the binary delayed signal 24 becomes closer to the state A in FIG. 8, resulting in that the timing of the level change of the binary delayed signal 24 is set on the time base away from the rising edge (the timing of the level change) of the sync clock signal 14. Conversely, when the value of the delay control signal 25 is counted up and increased, the variable delay circuit 22 delays the timing of the level change of the binary delayed signal 24 on the time base in such a manner that the timing of the level change of the binary delayed signal 24 becomes closer to the state B in FIG. 8, resulting in that the timing of the level change of the binary delayed signal 24 is set on the time base away from the rising edge (the timing of the level change) of the sync clock signal 14.

Figure 10:
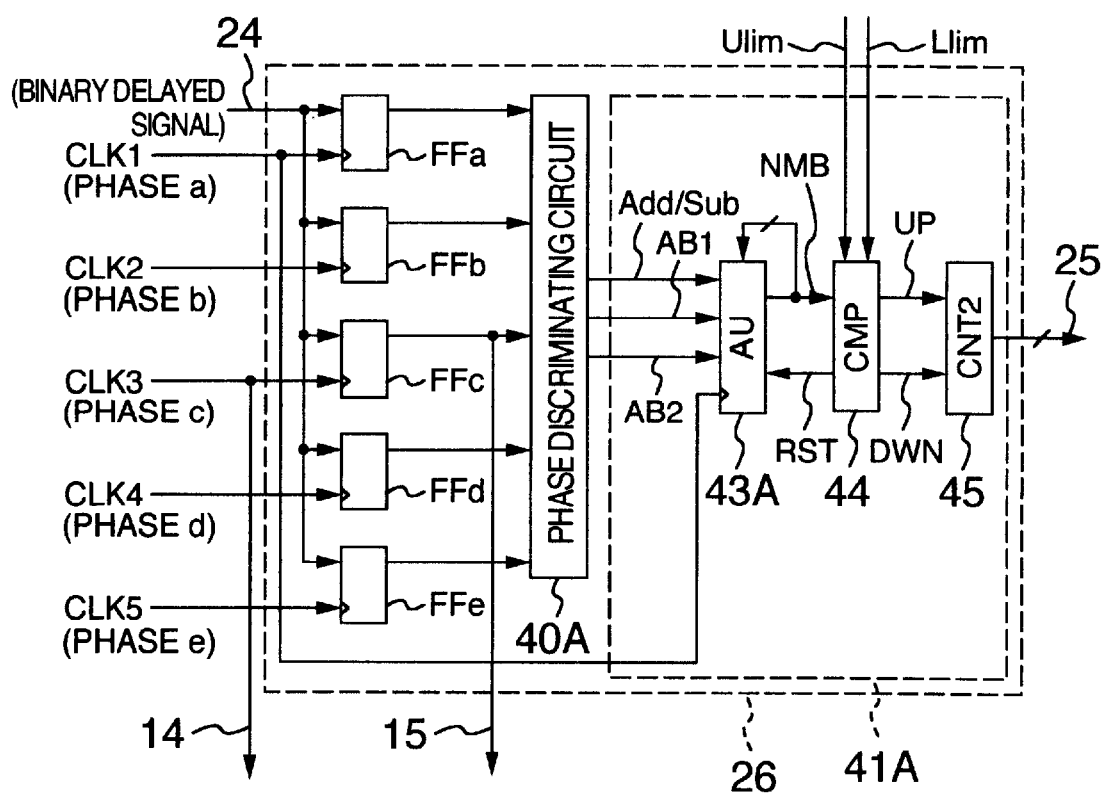
FIG. 10 is a block diagram of another example of the delay control circuit which can be used in the data strobe circuit of FIG. 4 and be arranged to detect even the size of an error to a control target.

FIG. 10 shows a second example of the delay control circuit 26. FIG. 10 is different from FIG. 7 in phase discrimination to the outputs of the latch circuits FFa to FFe and in operational operations in response thereto. A signal producing circuit 41A has an add/subtract circuit 43A in place of the first up/down counter 43 in the signal producing circuit 41 in FIG. 7. More specifically, a phase discriminating circuit 40A detects (reads out) the outputs of the latch circuits FFa to FFe concurrently to thereby detect time lengths by which the timing of the level change of the binary delayed signal 24 is advanced and delayed with respect to rising edge of the sync clock signal 14. In the example of FIG. 8, for example, the phase discriminating circuit 40A outputs an operational instruction signal Add/Sub to instruct subtraction in the delay state of FIG. 8, (1) and (2) and addition in the delay state of FIG. 8, (3) and (4) as the advance/delay detection signal, a first numeric value signal AB1 indicative of an absolute value 1 in the states of FIG. 8, (1) and (4), and a second numeric value signal AB2 indicative of an absolute value 2 in the states of FIG. 8, (2) and (3). The signals Add/Sub, AB1 and AB2 are supplied to the add/subtract circuit (AU) 43A as another example of the first operational circuit. The add/subtract circuit 43A latches its operational result in its output stage, adds to the immediately-previous operational result the numeric value instructed by the numeric value signal AB1 or AB2 since the numeric value signal AB1 or AB2 is asserted when addition is instructed by the operational instruction signal Add/Sub, and subtracts from the immediately-previous operational result the numeric value instructed by the numeric value signal AB1 or AB2 since the numeric value signal AB1 or AB2 is asserted when subtraction is instructed by the signal Add/Sub. The processing of the count value NMB as the operational result is the same as that in the case of FIG. 7. The arrangement of FIG. 10 can have a phase control response better than that in the arrangement of FIG. 7.

Figure 11:
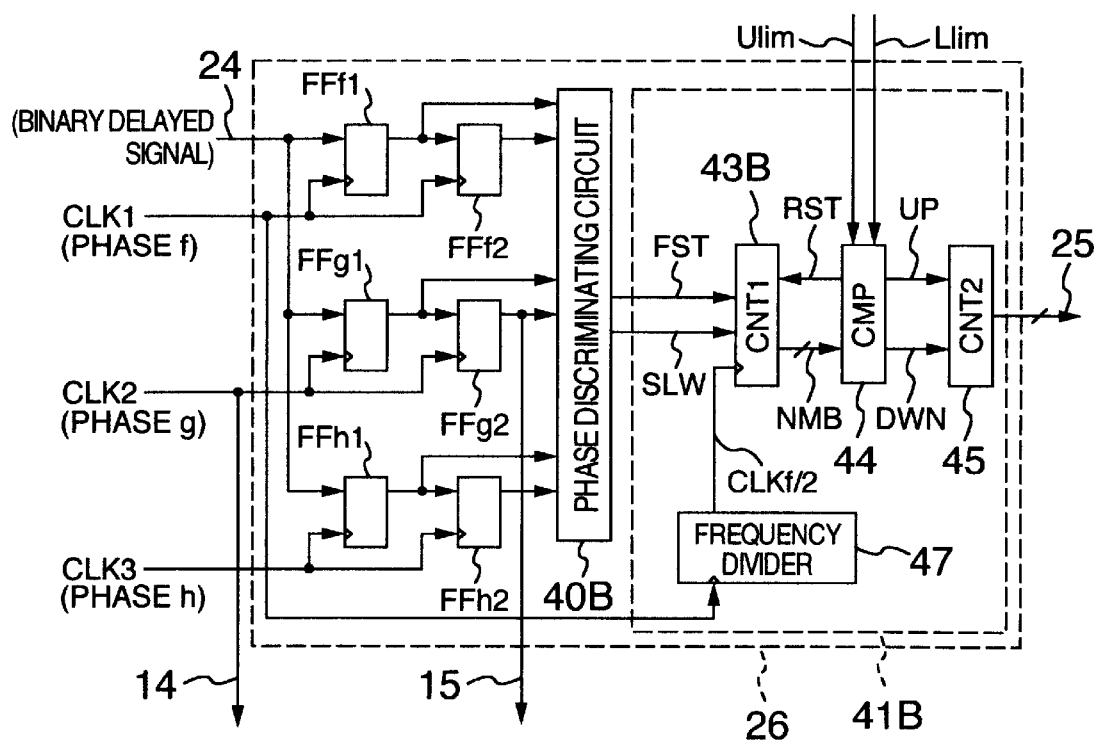
FIG. 11 is a block diagram of another example of the delay control circuit which can be used in the data strobe circuit of FIG. 4 and be arranged to detect a level change in the binary delayed signal with respect two periods of the sync clock signal.
Figure 12:
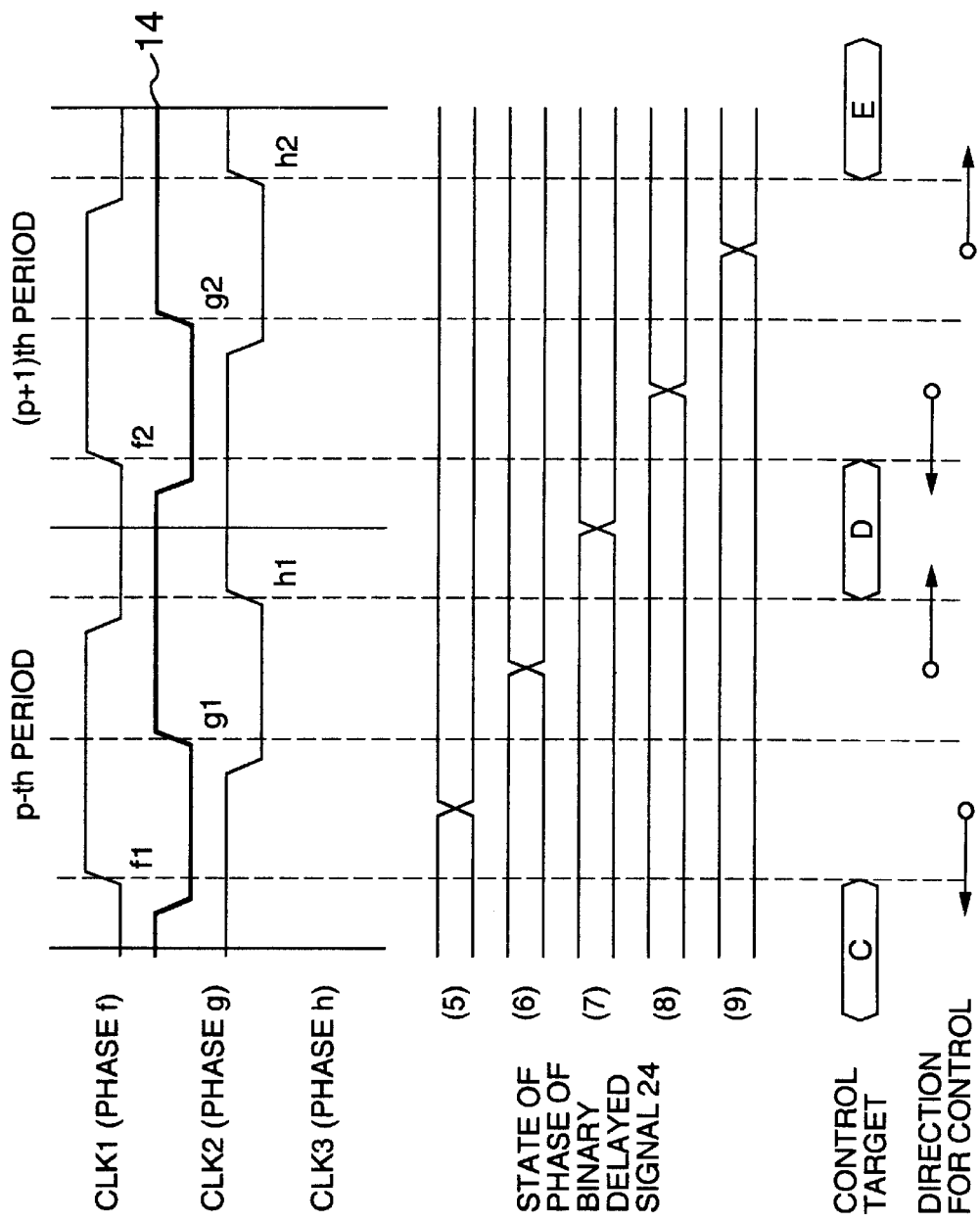
FIG. 12 is a time chart showing operation of the phase discriminating circuit in the delay control circuit of FIG. 11.

FIG. 11 shows a third example of the delay control circuit 26. And exemplified in FIG. 12 is operational timing of the delay control circuit 26 having such an arrangement as shown in FIG. 11. It is assumed in this example that n=3 and 3 phase clock signals CLK1 to CLK3 sequentially shifted by a phase 2π/3 are output from the voltage controlled oscillator 32. It is further assumed that the clock signals CLK1 to CLK3 have sequential phases f, g and h. In this example, the signal of the phase g is used as the sync clock signal 14.

The first circuit of the delay control circuit 26 has a plurality of stages (2 stages in the illustrated example) of latch circuits FFf1, FFf2, FFg1, FFg2, FFh1 and FFh2 connected in series in response to the clock signals CLK1 to CLK3 so that data output terminals of the first stage are coupled with data input terminals of the next stage and the first and second stages are commonly connected at their clock input terminal. In the plural stages of latch circuits, the binary delayed signal 24 is supplied to the data input terminals of the latch circuits FFf1, FFg1 and FFh1 in the first stage, and the corresponding clock signals CLK1 to CLK3 are supplied to the clock input terminals commonly connected. The latch circuits FFf1, FFf2, FFg1, FFg2, FFh1 and FFh2 perform latch operations in synchronism with the first level change (e.g., rising change) of the corresponding clock signals CLK1 to CLK3. An output of the latch circuit FFg2 latched by the phase g signal is used as the reproduced data 15. The reproduced data 15 may be an output of the latch circuit FFg1.

The delay control circuit 26 further includes a phase discriminating circuit 40B for generating a advance/delay detection signal indicative of a time relationship of the phase of the binary delayed signal to the phases of the multi-phase clock signals on the basis of outputs of latch circuits FFf1, FFf2, FFg1, FFg2, FFh1 and FFh2, and a second circuit having a signal producing circuit 41B for outputting the delay control signal 25 to the variable delay circuit 22 to change the timing of the level change of the binary delayed signal 24 in such a direction as away from the timing of the first level change (falling change) of the sync clock signal 14 on the time base on the basis of a discrimination result signal from the phase discriminating circuit 40B.

The phase discriminating circuit 40B detects (reads out) outputs of the latch circuits FFf1, FFf2, FFg1, FFg2, FFh1 and FFh2, concurrently detects whether the timing of the level change of the binary delayed signal 24 is advanced or delayed with respect to the timing of the rising change of the sync clock signal 14, and generates a advance/delay detection signal (FST or SLW). Signals of the phases f and h have phase differences of −2π/3 and +2π/3 respectively with respect to the phase g of the sync clock signal 14 as a reference. It is not always required for the signals of the phases f, g and h to have all a duty of 50% and is only required for the signals to be phase shifted nearly equally. The signals of the phase f and h are auxiliary clock signals for judgement of a phase relationship between the sync clock signal 14 and binary delayed signal 24.

Assuming that latch data of the 6 latch circuits FFf1, FFf2, FFg1, FFg2, FFh1 and FFh2 are denoted by f1, f2, g1, g2, h1 and h2 for the phases f, g and h, then all the latch data are input to the phase discriminating circuit 40B. Assuming that the sync clock signal 14 has a period of T, then the inputs of the phase discriminating circuit 40B change for each T/3 period. Since the latch circuits FFf1, FFf2, FFg1, FFg2, FFh1 and FFh2 are arranged in the form of two series-connected stages of shift registers, it is possible to detect the timing of the level change of the binary delayed signal 24 in consecutive 2 periods of the (sync clock signal 14. That is, the data latch states of all the latch circuits FFf1, FFf2, FFg1, FFg2, FFh1 and FFh2 are sequentially determined for every 2 periods of the sync clock signal 14.

Explanation will be made as to advantageous points of the latch circuits thus arranged in the form of two series-connected stages of shift registers. In a CD-ROM or DVD medium, it is prescribed according to its specifications that the shortest length of consecutive logical values of 1 or 0 correspond to 3 periods of the sync clock signal 14. Accordingly, when the timing of the level change of the binary delayed signal 24 is detected in continuous 2 periods of the sync clock signal 14, it is impossible to detect 2 level changes (rising or falling changes) according to the specifications. However, there may sometimes occur a case where a flaw or the like causes a level change to appear in the sync clock signal 14 for each one period thereof. When a level change in the binary delayed signal is detected in consecutive 2 periods of the sync clock signal 14, it is possible to find such erroneous data and control a delay with use of only reliable data.

In a time relationship between the phases of the clock signals CLK1 to CLK3 of the phases f, g and h as exemplified in FIG. 12 and the phase of the binary delayed signal 24, states (5) and (8) indicate that the binary delayed signal 24 is delayed with respect to the sync clock signal 14, a state (7) indicates the optimum state, and states (6) and (9) indicate that the binary delayed signal 24 is advanced with respect the sync clock signal 14. In this example, states C, D and E are control targets. Changes in the delayed signal for each period caused by a flaw, etc. on a disc are as when the state (5) of FIG. 12 occurs in consecutive two periods. That is, the same state is continuously detected. The phase discriminating circuit 40B excludes such same state in consecutive two periods as an object to be detected.

Meanwhile, when phase discrimination is repeated for each period of the sync clock signal 14 and a normal signal change is detected, for example, the signal change is detected in a p-th period as the state (5) that the binary delayed signal 24 is delayed with respect to the sync clock signal 14, but it is detected in the next (p+1)-th period as the same delayed state (8) as the above. That is, the single change point of the binary delayed signal 24 is detected as the different delayed states.

In the first technique for avoiding such double detection of the normal state, as shown in FIG. 13A, the time relationship between the phase of the sync clock signal 14 and the phase of the binary delayed signal 24 is detected once for 2 periods of the sync clock signal 14. For achieving this, for example, it is only required for the phase discriminating circuit 40B to perform its discriminating operation only in even-numbered periods of the sync clock signal 14. In the second technique, as shown in FIG. 13B, when it is desired for the phase discriminating circuit 40B to perform its discriminating operation in each period of the sync clock signal 14, either one of the states (5) and (8) and either one of the states (6) and (9) are excluded as its object to be detected. For examples the phase discriminating circuit 40B in FIG. 11 employs such a decode logic as to be able to detect only the three states (5), (6) and (7) in FIG. 12 on the basis of the data f1, f2, g1, g2, h1 and h2. The example, of FIG. 11 is based on the former example, which will be explained bellow.

In the example of FIG. 11, the phase discriminating circuit 40B, when detecting the delayed states (5) and (8), asserts the delay detection signal SLW in the signal producing circuit 41B, whereas, when detecting the advanced states (6) and (9), the phase discriminating circuit 40B asserts the advance detection signal FST in the signal producing circuit 41B.

The signal producing circuit 41B includes an first up/down counter (CNT1) 43B forming a first operational circuit, a comparator (CMP) 44 forming an arrival detecting circuit, a second up/down counter (CNT2) 45 forming a second operational circuit, and a frequency divider 47. The frequency divider 47 generates a clock signal CLKf/2 having a period corresponding to twice the period of the phase f signal.

The first up/down counter 43B inputs the delay detection signal SLW and advance detection signal FST in synchronism with a rising edge of the clock signal CLKf/2, counts down by −1 in response to the assert state of the delay detection signal SLW, and counts up by +1 in response to the assert state of the advance detection signal FST.

The comparator 44 inputs the count value NMB from the up/down counter 43B and detects whether the count value NMB reached a first threshold value, e.g., an upper limit value Ulim or reached a second threshold value, e.g., a lower limit value Llim. The upper and lower limit values Ulim and Llim are values which are used to determine the control sensitivity of the delay control circuit 26 programmably assigned by the control circuit 27. The comparator 44 asserts the up signal UP when detecting the arrival at the upper limit value Ulim as an arrival detection signal, and asserts the down signal DWN when detecting the arrival at the lower limit value Llim. The assert state of the up or down signal UP or DWN is informed to the first up/down counter, 43B in the form of the reset signal RST, whereby the count value of the first up/down counter 43B is reset at its initial value of 0.

The second up/down counter 45 inputs up and down signals UP and DWN, counts down by −1 in response to the assert state of the down signal DWN., and counted up by +1 in response to the assert state of the up signal UP. The count value of the second up/down counter 45 is used as the delay control signal 25.

When the value of the delay control signal 25 is counted down and decreased, the variable delay circuit 22 advances the timing of the level change of the binary delayed signal 24 in such a manner as to move the timing closer to the state C when the timing of the level change of the binary delayed signal 24 is in the state (5) of FIG. 12 and to move the timing closer to the state D when the timing is in the state (8) of FIG. 12. That is, the timing of the level change of the binary delayed signal 24 is set on the time base away from the rising edge (timing of the level change) of the sync clock signal 14. Conversely, when the value of the delay control signal 25 is counted up and increased, the variable delay circuit 22 delays the timing of the level change of the binary delayed signal 24 in such a manner as to move closer to the state D when the timing of the level change of the binary delayed signal 24 is in the state (6) of FIG. 12 and to move closer to the state E when the timing is in the state (9) thereof, whereby the timing of the level change of the binary delayed signal 24 is set on the time base away from the rising edge (the timing of the level change) of the sync clock signal 14.

The data strobe circuit 12 in the foregoing embodiment can provide operations and effects (1) to (6) which follow.
(1) The delay of the binary delayed signal 24 caused by the variable delay circuit 22 is controlled so that the timing of the level change of the binary delayed signal 24 is set away from the rising edge of the sync clock signal 14. Thus when the duty of the sync clock signal 14 is shifted from 50% as the frequency of the sync clock signal 14 is increased with its increased data transfer rate, a margin can be made as large as enough to be able to latch a normal signal value by the latch circuit and accurate reproduced data can be accurately obtained from the binary signal 11, even when a jitter takes place in the sync clock signal 14 or binary signal 11.

(2) The multi-phase clock signals 23 in the voltage controlled oscillator 32 are used for phase discrimination. Therefore, even when the oscillation frequency of the voltage controlled oscillator 32 is changed by a variation in the transfer rate of the input signal, the phase discrimination sensitivity can be set constant.

(3) Since the binary signal 11 is subjected to the delay control, control can be easily realized with a reliability higher than that of the case of equalizing the multi-phase clock signals 23 for the delay control.

(4) The shift register arrangement of latch circuits connected in series is employed to detect the level change of the binary delayed signal 24 with use of latch data corresponding to a plurality of periods of the sync, clock signal 14 as a unit. Thus an erroneous change ion the binary delayed signal caused by, e.g., a flow or the like on a disc can be discriminated and a delay to the variable delay circuit can be controlled with use of only reliable signal changes.

(5) When the phase is judged as shifted from its control target based on the phase discrimination between the sync clock signal 14 and binary delayed signal 24, the count value of the up/down counter 45 for generating the delay control signal 25 to the variable delay circuit 22 is increased or decreased. For the purpose of modifying the control sensitivity, the state where the binary delayed signal 24 is delayed or advanced with respect to the sync clock signal 14 is accumulated or integrated by the operational circuits 43, 43A or 43B, the accumulated or integrated value (delay control signal) 25 of the up/down counter 45 is updated when the count value reached the lower or upper limit value Llim or Ulim arbitrarily assigned by the control circuit 27, thus updating a delay to the variable delay circuit 22. Thereby the phase relationship between the sync clock signal 14 and binary delayed signal 24 can be stably converged to its control target.

(6) When even the size of an error to the control target as has been explained in connection with FIG. 10 is additionally judged, the convergence to the control target can be made fast.

Although the invention made by the inventor of the present application has been explained in detail in connection with embodiments of the present invention, it goes without saying that the present invention is not limited only to the illustrated examples but it may be modified in various ways without departing from a spirit and scope thereof.

For example, signals to be recorded on a medium are not limited to having periods of 3T to 11T. Further, the number of stages of latch circuits connected in series and arranged as a shift register is not limited to 2 but may be set at 3 or more. The ring oscillator is not limited to a differential type but may be of a single end type. The variable delay circuit is not limited to such a circuit configuration as to control the delay time by controlling the mutual conductance of the operational current, but such a configuration as to control the delay time by variably controlling the number of gate stages may be employed.

In addition, in FIG. 11, the first up/down counter 43B has been arranged to input the signals FST and SLW for each 2 periods of the clock signal 1 of the phase f. Conversely, however, the detection result may be output to the phase discriminating circuit 40B at a rate of once for each 2 periods of the signal of the phase f.

In accordance with the foregoing embodiments, the influences caused by manufacturing fluctuations, a characteristic change with time passage, a jitter, etc. can be accommodated, the optimum strobe point can be automatically corrected, and the reproduced data synchronized with the reproduced clock signal can be extracted a high quality of data with less error.

What is claimed is:

1. A storage media reading system comprising:

a phase detector having first and second input terminals, a binary signal obtained from data recorded on a recording medium and carrying said data being supplied to said first terminal;

a voltage controlled oscillator for generating (2m+1) multi-phase clock signals (m being a positive integer) which are changed in oscillation frequency according to an output of said phase detector and which are mutually shifted in phase by an integral multiple of $2\pi/(2m+1)$ and for extracting one of said multi-phase clock signals as a sync clock signal for data reproduction and for supplying part of the sync clock signal to the second input terminal of said phase detector;

a variable delay circuit for delaying said binary signal by a controllable delay time to generate a binary delayed signal; and a delay control circuit including first circuits for determining a value of the binary delayed signal from said variable delay circuit in synchronism with said sync clock signal to generate a reproduced data signal and also including a second circuit for comparing a phase of the binary delayed signal from said variable delay circuit with phases of the multi-phase clock signals from said voltage controlled oscillator to generate a delay control signal to be supplied to said variable delay circuit for control of said delay time, said reproduced data signal and said sync clock signal being used to reproduce the data recorded on said recording medium.

2. A storage media reading system as set forth in claim 1, wherein said voltage controlled oscillator comprises a ring oscillator including an odd number of delay gate stages connected in a ring form, said multi-phase clock signals are obtained from respective outputs of said delay gate stages, and said sync clock signal is obtained from one the outputs of said delay gate stages.

3. A storage media reading system as set forth in claim 2, wherein the first circuits of said delay control circuit comprises a plurality of sets of latch circuits connected in series to correspond to said multi-phase clock signals of the delay gate stages of the ring oscillator of said voltage controlled oscillator, latch clock input terminals of said sets of latch circuits connected in series being connected commonly, one of said multi-phase clock signals being supplied to said latch clock input terminals, said binary delayed signal being supplied to data input terminals of first one of the set stages of the latch circuits connected in series, each of said latch circuits latching a value of said binary delayed signal in synchronism with a first level change of associated one of said multi-phase clock signals, and wherein the second circuit of said delay control circuit includes a phase discriminating circuit for generating a advance/delay detection signal indicative of a time relationship of the phase of said binary delayed signal to the phases of said multi-phase clock signals on the basis of outputs of said plurality of latch circuits and a signal producing circuit for generating said delay control signal to move timing of a level change of said binary delayed signal on a time base in such a direction as away from the timing of said first level change of said sync clock signal in response to a detection signal from said phase discriminating circuit.

4. A storage media reading system as set forth in claim 3, wherein said phase discriminating circuit generates said advance/delay detection signal at a rate of once for a plurality of cycles of said multi-phase clock signals from the delay gate stages of the ring oscillator of said voltage controlled oscillator.

5. A storage media reading system as set forth in claim 3, wherein said signal producing circuit receives said advance/delay detection signal from said phase discriminating circuit at a rate of once for a plurality of cycles of said multi-phase clock signals from the delay gate stages of the ring oscillator of said voltage controlled oscillator.

6. A storage media reading system as set forth in claim 3, wherein said phase discriminating circuit detects the outputs of said plurality of latch circuits concurrently and generates said advance/delay detection signal indicative of whether the timing of the level change of said binary delayed signal is advanced or delayed on the time base with respect to the timing of the first level change of said multi-phase clock signals, wherein said signal producing circuit includes a first operational circuit for updating a count value in a first direction and in a second direction opposite thereto when the advance/delay detection signal from said phase discriminating circuit indicates that the timing of the level change of said binary delayed signal is advanced and delayed respectively, an arrival detection circuit for generating arrival detection signals indicative of the fact that the count, value of said first operational circuit reached a first threshold value in said first direction and reached a second threshold value in said second direction, and a second operational circuit for updating the count value in a third direction and in a fourth direction opposed thereto and for generating the updated count value as said delay control signal when said arrival detection signal indicates the arrival at said first threshold value and the arrival at said second threshold value in response to the arrival detection signal from said arrival detection circuit, to thereby move the timing of the level change of said binary delayed signal on the time base in such a direction as away from the timing of the first level change of said sync clock signal, and wherein said variable delay circuit advances the timing of the level change of said binary delayed signal on the time base with use of said delay control signal generated when the count value of said second operational circuit is updated in said third direction to move the timing away from the timing of the first level change of said sync clock signal, and delays the timing of the level change of said binary delayed signal with use of said delay control signal generated when the count value of said second operational circuit is updated in said fourth direction to move the timing away from the timing of the first level change of said sync clock signal.

7. A storage media reading system as set forth in claim 6, wherein a count value of said first operational circuit in said signal producing circuit is initialized in response to updating operation (RST) of said second operational circuit.

8. A storage media reading system as set forth in claim 6, wherein said variable delay circuit includes a D/A converter for converting said delay control signal generated when the count value of said second operation circuit in said delay control circuit is updated into an analog signal, and a delay circuit for receiving said binary signal and generating said binary delayed signal by controlling its mutual conductance according to an output of said D/A converter to control a delay time and to delay said binary signal by said controlled delay time.

9. A storage media reading system as set forth in claim 3, wherein said phase discriminating circuit detects the outputs of said plurality of latch circuits concurrently and generates a advance/delay detection signal indicative of a time length by which the timing of the level change of said binary delayed signal is advanced or delayed with respect to the timing of the first level change of said multi-phase clock signals, wherein said signal producing circuit includes a first operational circuit for updating a count value in a first direction and in a second direction opposite thereto when a advance/delay detection signal from said phase discriminating circuit indicates that the timing of the level change of said binary delayed signal is advanced and delayed, an arrival detection circuit for generating arrival detection signals indicative of the fact that the count value of said first operational circuit reached a first threshold value in said first direction and reached a second threshold value in said second direction, a second operational circuit for updating a count value in a third direction and in a fourth direction opposite thereto when said arrival detection signal indicates arrival at said first threshold value and arrival at said second threshold value in response to the arrival detection signal from said arrival detection circuit and for generating the updated count value as said delay control signal to thereby move the timing of the level change of said binary delayed signal on the time base in such a detection as away from the timing of the first level change of said sync clock signal, and wherein said variable delay circuit advances the timing of the level change of said binary delayed signal on the time base with use of said delay control signal generated when the count value of said second operational circuit is updated in said third direction to thereby move the timing away from the timing of the first level change of said sync clock signal, and delays the timing of the level change of said binary delayed signal on the time base with use of said delay control signal generated when the count value of said second operational circuit is updated in said fourth direction to thereby move the timing away from the timing of the first level change of said sync clock signal.

10. A storage media reading system as set forth in claim 1, wherein the first circuits of said delay control circuit comprises a plurality of latch circuits from said voltage controlled oscillator each provided to correspond to associated one of said multi-phase clock signals, each of said latch circuits latching a value of said binary delayed signal in synchronism with a first level change of associated one of said multi-phase clock signals, and wherein the second circuit of said delay control circuit comprises a phase discriminating circuit for generating a advance/delay detection signal indicative of a time relationship of the phase of said binary delayed signal to the phases of said multi-phase clock signals on the basis of outputs of said plurality of latch circuits and a signal producing circuit for generating said delay control signal to move timing of a level change of said binary delayed signal in such a direction as away from timing of said first level change of said sync clock signal on a time base in response to a detection signal from said phase discriminating circuit.

* * * * *